United States Patent [19]

Parsi et al.

[11] Patent Number: 5,015,892
[45] Date of Patent: May 14, 1991

[54] ASYNCHRONOUS DELAY CIRCUIT

[75] Inventors: Kaveh Parsi, Tempe; David B. Harnishfeger, Chandler, both of Ariz.

[73] Assignee: Motorola, Inc., Schaumburg, Ill.

[21] Appl. No.: 494,293

[22] Filed: Mar. 16, 1990

[51] Int. Cl.$^5$ .......................... H03K 5/13; H03K 5/22; H03K 5/159

[52] U.S. Cl. .................................. 307/600; 307/603; 307/494; 307/498; 307/353; 328/55; 328/147

[58] Field of Search .............. 307/600, 602, 603, 605, 307/608, 494, 498, 525, 524, 270, 353; 328/55, 66, 146, 147

[56] References Cited

U.S. PATENT DOCUMENTS 4,524,292  6/1985  Nagano ............................. 307/498
4,950,917  8/1990  Holler et al. ...................... 307/498

Primary Examiner—Stanley D. Miller
Assistant Examiner—Trong Phan
Attorney, Agent, or Firm—Michael D. Bingham; Bradley J. Botsch

[57] ABSTRACT

A circuit for asynchronously delaying an input signal whereby the precision of the time delay is proportional to the precision of the clock. A first circuit is coupled across a first capacitor for charging the first capacitor to a predetermined voltage when the clock is in a first logic state and discharging the first capacitor when the clock is in a second logic state. A peak-hold circuit having an input coupled to a first terminal of the first capacitor and an output signal at an output that provides a reference voltage representative of the peak voltage occurring at the input of the peak-hold circuit which is a function of the time interval the clock occupied the first logic state. A second circuit is coupled across a second capacitor for charging the second capacitor when the input signal is in a first logic state, and discharging the second capacitor when the input signal is in a second logic state. Also, a comparator having a first input coupled to the output of the peak-hold circuit, a second input coupled to a first terminal of the second capacitor, and an output at which an output signal is provided that represents the input signal delayed by a predetermined time which is a function of the reference voltage.

7 Claims, 1 Drawing Sheet

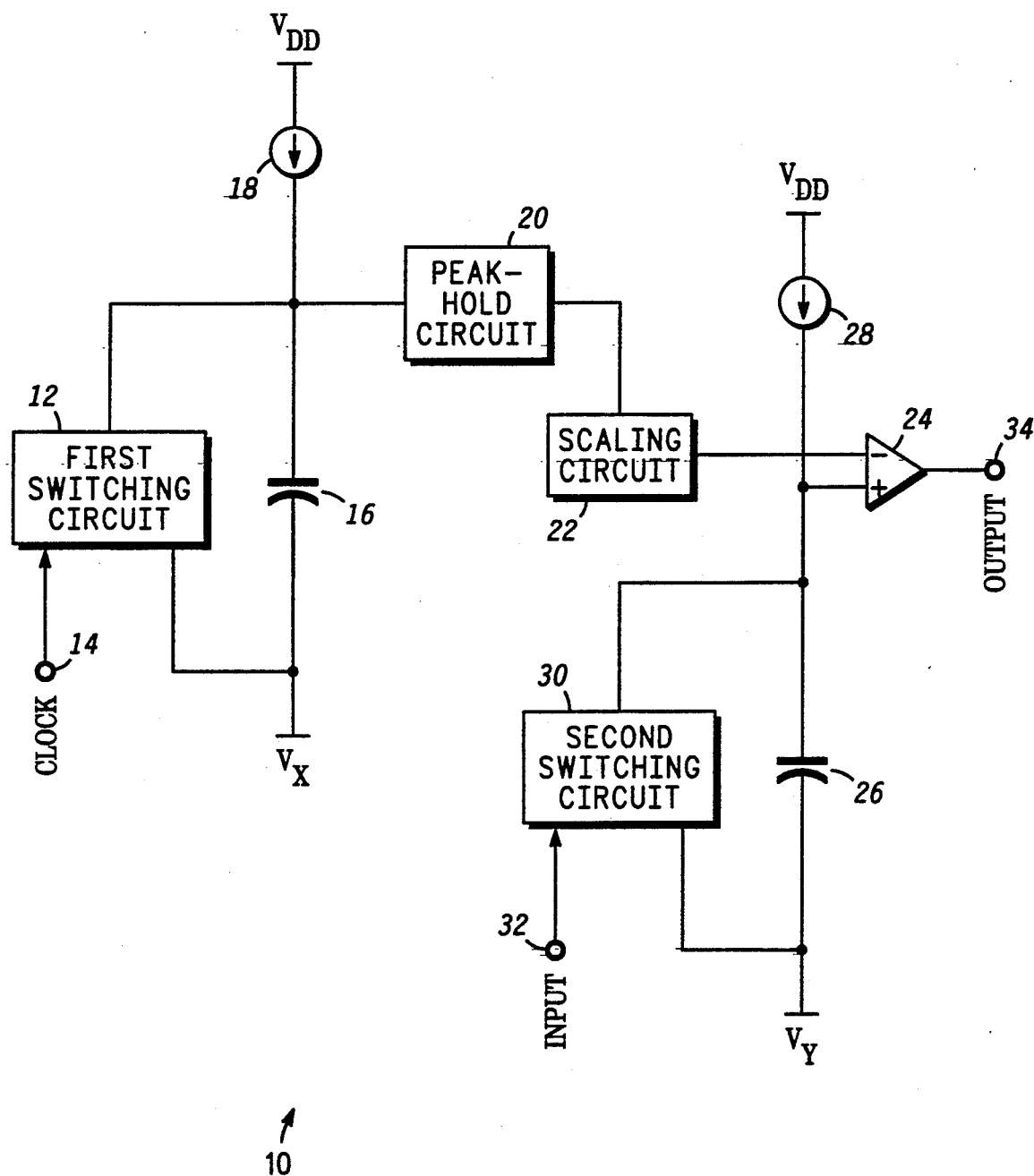

ASYNCHRONOUS DELAY CIRCUIT

BACKGROUND OF THE INVENTION

The present invention relates to delay circuits and, more particularly, to an asynchronous delay circuit scaled from an accurate time reference.

Asynchronous delay circuits are utilized in many applications that require a signal to be delayed independent of a clock. However, most, if not all, asynchronous delay circuits are directly generated from a predetermined time constant that is set by the values of resistors and capacitors and, thus, the precision of the desired delay is directly related to the precision of the individual components used therein. Therefore, a precise delay can only be as precise as the precision of the components that are used in the delay circuit.

Hence, a need exists for an asynchronous delay circuit that is independent of the precision of the individual components used in the circuit.

SUMMARY OF THE INVENTION

Accordingly, it is an object of the present invention to provide an improved asynchronous delay circuit.

Another object of the present invention is to provide an asynchronous delay circuit derived from a time reference.

In carrying out the above and other objects of the present invention, there is provided an asynchronous delay circuit for providing an output signal that is delayed by a predetermined time respective to an input signal applied thereto and having an input coupled to a clock comprising a first capacitor, first circuit coupled across the first capacitor for charging the first capacitor to a predetermined voltage when the clock is in a first logic state and discharging the first capacitor when the clock is in a second logic state; peak-hold circuit having an input coupled to a first terminal of the first capacitor and an output for providing an output signal that represents the peak voltage occurring at the input of the peak-hold circuit; a second capacitor, second circuit responsive to the input signal and coupled across the second capacitor for charging the second capacitor when the input signal is in a first logic state, and discharging the second capacitor when the input signal is in a second logic state; and a comparator having a first input coupled to the output of the peak-hold circuit, a second input coupled to a first terminal of the second capacitor, and an output which provides the output signal that is the input signal delayed by a predetermined time after the input signal is applied to the second circuit.

The above and other objects, feature and advantages of the present invention will be better understood from the following detailed description taken in conjunction with the accompanying drawing.

BRIEF DESCRIPTION OF THE DRAWING

The sole FIG. is a partial schematic and block diagram illustrating the preferred embodiment of the present invention.

DETAILED DESCRIPTION OT THE PREFERRED EMBODIMENT

Referring to the sole FIG., a partial schematic and block diagram of an asynchronous delay circuit 10 of the present invention is shown comprising first switching circuit 12 responsive to a time reference, which from hereon will be referred to as a clock, applied at terminal 14 and having a first terminal coupled to the first terminal of capacitor 16 and a second terminal coupled to the second terminal of capacitor 16 and to a first supply voltage terminal at which the operating potential $V_X$ is applied. Independent current source 18 is coupled between a second supply voltage terminal, at which the operating potential $V_{DD}$ is applied, and the first terminal of capacitor 16. The present invention further comprises peak hold circuit 20 having an input coupled to the first terminal of capacitor 16 and an output coupled to the input of scaling circuit 22 which has an output coupled of the first input of comparator 24. The second input of comparator 24 is coupled to the first terminal of capacitor 26 while independent current source 28 is coupled between operating potential $V_{DD}$ and the second input of comparator 24. Second switching circuit 20 is responsive to an input signal applied at terminal 32 and has a first terminal coupled to the first terminal of capacitor 26 and a second terminal coupled to the second terminal of capacitor 26 and to a third supply voltage terminal at which the operating potential $V_Y$ is applied. Finally, the output of comparator 24 is coupled to output terminal 34.

In operation, a clock is typically applied at terminal 14 which controls the opening and closing of first switching circuit 12 such that when the clock is at first logic state, first switching circuit 12 acts like an open circuit thereby allowing independent current source 18 to charge-up capacitor 16 to a predetermined voltage based upon the duration of time that the clock occupied the first logic state. On the other hand, when the clock is at a second logic state, first switching circuit 12 steers independent current source 18 away from capacitor 16 and flows through first switching circuit 12 thereby allowing capacitor 16 to discharge for the full duration of time that the clock occupies the second logic state or until it discharges to voltage potential $V_X$. Thus, first switching circuit 12 and independent current source 18 act together as a means to charge-up and discharge capacitor 16. Furthermore, it should be obvious to one of ordinary skill in the art that the situation could be reversed whereby capacitor 16 discharges to a predetermined voltage based upon the time duration that the clock occupied the first logic state and charges up when the clock is in the second logic state.

In addition, peak-hold circuit 20 has an output that represents the peak voltqage occurring at the imput terminal of peak-hold circuit 20 which is dependent upon the voltage across capacitor 16 plus the voltage level of operating potential $V_X$. Therefore, the output of peak-hold circuit 20 is a reference voltage that is proportional to the time duration of the first logic state of the clock which is also the time spent charging up capicator 16. Or equivalently, the output of peak-hold circuit 20 is a reference voltage that is derived from a time interval of the clock applied at terminal 14. Therefore, the precision of the reference voltage provided at the output of peak-hold circuit 20 is proportional to the precision of the clock applied at terminal 14.

Furthermore, scaling circuit 22 simply scales the output voltage of peak-hold circuit 20 by a predetermined factor, of which the significance will be discussed later. The operation of the input applied at terminal 32, second switching circuit 30, independent current source 28 and capacitor 26 operate in an analogous manner as described for the clock applied at terminal 14, first switching circuit 12, independent current source 18 and capacitor 16. Therefore, an input signal that is to be delayed by a predetermined time is applied at terminal 14 which controls the opening and closing of second switching circuit 30 such that when the input signal is a logic high, second switching circuit 30 acts like an open circuit thereby allowing independent current source 28 to charge-up capacitor 26 for the duration of time that the input signal is high. On the other hand, when the input signal is a logic low, second switching circuit 30 becomes low impedance, therefore, idependent current source 28 is steering away from capacitor 26 and flows through second switching circuit 30, therby allowing capacitor 26 to discharge for the full duration of time that the input signal is low or until it discharges to voltage potential $V_Y$. Similarly, second switching circuit 30 and independent current source 28 act together as a means to charge-up and discharge capacitor 26. Therefore, when the input signal applied at terminal 32 allows capacitor 26 to charge-up to a voltage level such that the voltage at the second input of comparator 24 exceeds the voltage level at the first input of comparator 24 which is substantially equal to the scaled output voltage of peak-hold circuit 20, output terminal 34 switches from a logic low to a logic high and represents a delayed version of the input signal applied at terminal 32. Therefore, the voltage occurring at the first input of comparator 24, which as aforementioned was orginally derived from a time interval of the clock applied at terminal 14, is converted back into a predetermined time interval at output terminal 34 in the form of a time delay. Therefore, an asynchronous delay has been provided that is proportional to a clock or time reference. It is important to realize that the pulse width of the input signal applied at terminal 3 must be longer than the predetermined time interval or capacitor 26 will not charge up to the sufficient voltage that allows comparator 24 to switch. Therefore, in view of the above, the preferred embodiment 10 also provides time filtering whereby narrow pulse width signals at terminal 32 that are not long enough to switch comparator 24 will not be present at output terminal 34.

As an example to illutrate the operation of preferred embodiment 10, consider the simple case where capacitors 16 and 26 are substantially equal to one another, independent current sources 18, and 28 are substantially equal to one another, voltage potentials $V_X$ and $V_Y$ are both substantially equal to ground and scaling circuit 22 has a scaling factor substantially equal to one. Therefore, the clock applied at terminal 14 charges up capacitor 16 to a predetermined voltage that is directly proportional to the time duration that the clock occupied the first logic state. This predetermined voltage is also present at the first input of comparator 24 via peak-hold circuit 20 and scaling circuit 22 as is understood. Futhermore, when the input signal at terminal 32 is a logic high, capacitor 26 charges up to a voltage such that when the voltage across capacitor 26 exceeds the predetermined voltage at the first input of comparator 24, output 34 goes to a logic high after a predetermined time delay for charging up capacitor 26. It should be realized that this predetermined time delay is directly proportional, and in this example, substantially equal, to the time duration that the clock occupied the first logic state.

It is worth noting that in preferred embodiment 10, a logic high signal applied at terminal 32 resulted in charging up capacitor 26, however, it should be understood that if a logic low signal applied at terminal 32 resulted in charging up capacitor 26, then the inputs on comparator 24 would simply be reversed to yield the desired delayed signal. Also, it is very important to realize that the delay of the signal at terminal 32 is substantially equal to the time duration that the clock occupied the first logic state, given the constraints for the capacitors, independent current sources and voltage supplies as aforementioned for this example. Furthermore, since preferred embodiment 10 would typically be built on an integrated circuit the ratios between each capacitor, independent current source and voltage source can be maintained to a high degree of precision as is known. Therefore, the accuracy of the delay is not dependent upon the precision of the individual components used within the delay circuit. Rather, the precision of the delay is proportional to the precision of the clock applied at terminal 14 and the precision of the ratios of the resistors and capacitors used. Futhermore, it is known that there are many high precision oscillators currently available. Therefore, a precise delay can be provided via a precise clock reference.

Futhermore, the beauty of preferred embodiment 10 is that many different delays can be provided by simply varying the ratios between each capacitor, independent current source, and/or voltage supply. For instance, one could implement one-half the delay in the above example by making capacitor 26 one-half the value of capacitor 16 or by doubling the value of independent current source 28 with respect to independent current source 18 or even by changing the voltage potential of $V_Y$ to be a predetermined voltage higher than the voltage potential of $V_X$. In addition, if scaling circuit 22 provided a scaling factor of one-half, then one could also implement one-half the delay of the above example. Therefore, it should be clear that numerous precision delays can be provided by utilizing a precise clock reference while controlling the ratios between the resistors and capacitors within the circuit.

By now it should be appreciated that there has been provided a novel asynchronous delay circuit derived from a clock reference that is independent of the precision of the individual components used in the circuit.

What is claimed is:

1. An asynchronous delay circuit for providing an output signal that is delayed by a predetermined time respective to an input signal applied thereto and having an input coupled to a clock, comprising:

a first capacitor;

first means responsive to the clock an coupled across said first capacitor for charging said first capacitor to a predetermined voltage when the clock is in a first logic state and discharging said first capacitor when the clock is in a second logic state;

peak-hold means having an input coupled to a first terminal of said first capacitor for providing an output signal at an output thereof representative of the peak voltage occurring at said input of said peak-hold means;

a second capacitor;

second means responsive to the input signal and coupled across said second capacitor for charging said second capacitor when the input signal is in a first logic state and discharging said second capacitor when the input signal is in a second logic state; and a comparator having a first input coupled to said output of said peak-hold means, a second input coupled to a first terminal of said second capacitor, and an output at which the output signal is provided that is delayed by a predetermined time after the input signal is applied to said second means.

2. The asynchronous delay circuit according to claim 1 wherein said first means includes:
   an independent current source coupled to said first terminal of said first capacitor; and
   a switching circuit responsive to the clock and coupled across said first capacitor.

3. The asynchronous delay circuit according to claim 1 wherein said second means includes:
   an independent current source coupled to said first terminal of said second capacitor; and
   a switching circuit responsive to the input signal and coupled across said second capacitor.

4. An improved asynchronous delay circuit for providing an output signal that is delayed a predetermined time respective to an input signal applied thereto and having an input coupled to a clock, including a capacitor and means for charging and discharging the capacitor, wherein the improvement comprises:
   peak-hold means having an input coupled to the capacitor for providing an output signal at an output thereof representative of the peak voltage occurring at said input of said peak-hold means;
   an additional capacitor;
   additional means responsive to the input signal and coupled across said additional capacitor for charging said additional capacitor when the input signal is in a first logic state and discharging said additional capacitor when said input signal is in a second logic state; and
   a comparator having a first input coupled to said output of said peak-hold means, a second input coupled to a first terminal of said additional capacitor, and an output at which the output signal is provided that is delayed by a predetermined time after the input signal is applied to said additional means.

5. The improved asynchronous delay circuit according to claim 4 wherein said means includes:
   an independent current source coupled to the first capacitor; and
   a switching circuit responsive to the clock and coupled across the capacitor.

6. The improved asynchronous delay circuit according to claim 4 wherein said additional mean includes:
   an independent current source coupled to said first terminal of said additional capacitor;and
   a switching circuit responsive to the input signal and coupled across said additional capacitor.

7. A method of asynchronously delaying an input signal from a clock, the method comprising the steps of:
   charging a first capacitor when the clock is in a first logic state and discharging said first capacitor when the clock is in a second logic state;
   generating a predetermined voltage that is a function of the time interval that the clock occupied said first logic state;
   charging a second capacitor when the input signal is in a first logic state and discharging said second capacitor when the input signal is in a second logic state;
   comparing said predetermined voltage to the voltage across said second capacitor, and
   generating an output signal when said voltage across said second capacitor exceeds said predetermined voltage, said output signal representative of the input signal delayed by a predetermined time interval which is a function of said predetermined voltage.

* * * * *